(12) United States Patent
Takeda

(10) Patent No.: US 10,923,398 B2
(45) Date of Patent: Feb. 16, 2021

(54) WAFER PROCESSING METHOD

(71) Applicant: DISCO CORPORATION, Tokyo (JP)

(72) Inventor: Noboru Takeda, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/453,017

(22) Filed: Jun. 26, 2019

(65) Prior Publication Data

US 2020/0006144 A1    Jan. 2, 2020

(30) Foreign Application Priority Data

Jun. 27, 2018 (JP) .............................. JP2018-121825

(51) Int. Cl.
*H01L 21/78* (2006.01)
*H01L 21/268* (2006.01)

(52) U.S. Cl.
CPC ............ *H01L 21/78* (2013.01); *H01L 21/268* (2013.01)

(58) Field of Classification Search
CPC ............................. H01L 21/78; B23K 26/0624
See application file for complete search history.

(56) References Cited

U.S. PATENT DOCUMENTS

| | | | | |
|---|---|---|---|---|
| 6,489,588 B1 * | 12/2002 | Hoekstra | ............ | B23K 26/0736 219/121.67 |
| 7,605,344 B2 * | 10/2009 | Fukumitsu | ............. | B23K 26/03 219/121.72 |
| 8,158,493 B2 * | 4/2012 | Shah | ...................... | B23K 26/38 438/463 |
| 9,536,786 B2 * | 1/2017 | Morikazu | ........... | H01L 21/6836 |
| 10,109,527 B2 * | 10/2018 | Oba | .................... | H01L 21/6836 |
| 10,297,710 B2 * | 5/2019 | Kirihara | ................ | B23K 26/382 |
| 10,483,149 B2 * | 11/2019 | Morikazu | ............... | H01L 21/78 |
| 2019/0161597 A1 * | 5/2019 | Pfeiffer | ................ | C08K 5/0016 |

FOREIGN PATENT DOCUMENTS

JP     2002192370 A    7/2002
JP     2014168790 A    9/2014

OTHER PUBLICATIONS

R. Ayouchi et al., "Morphological and optical properties fo silicon thin films by PLD", Applied Surface Science, vol. 255, Elsevier, 2009, pp. 5299-5302 (Year: 2009).*

* cited by examiner

*Primary Examiner* — William Coleman
(74) *Attorney, Agent, or Firm* — Greer Burns & Crain, Ltd.

(57) ABSTRACT

A wafer processing method of dividing a wafer into a plurality of chips along a plurality of division lines includes: a shield tunnel forming step of causing a focusing point of a pulsed laser beam of a wavelength having a transmitting property with respect to the wafer to be positioned inside the wafer and applying the pulsed laser beam, and then forming a plurality of shield tunnels each including a fine hole and an amorphous region shielding the fine hole along the division lines; and a wafer dividing step of applying an external force to the wafer and then dividing the wafer in which the shield tunnels are formed along the division lines, in which the pulsed laser beam is split to have two or more of the focusing points which are along a direction parallel to the division lines.

7 Claims, 8 Drawing Sheets

WAFER PROCESSING METHOD

BACKGROUND OF THE INVENTION

Field of the Invention

The present invention relates to a wafer processing method used in dividing a wafer along a plurality of division lines.

Description of the Related Art

In a manufacturing step of a semiconductor device chip, formed is a semiconductor wafer having a plurality of devices such as integrated circuits (ICs) and large-scale integrations (LSIs) in separated respective regions partitioned by a plurality of crossing division lines set on the wafer. The semiconductor wafer is divided along the plurality of division lines, and accordingly, a plurality of semiconductor device chips each having the device therein can be obtained. Similarly, by dividing an optical device wafer formed with a plurality of optical devices such as light emitting diodes (LEDs) in respective regions partitioned by a plurality of crossing division lines set on the optical device wafer, a plurality of optical device chips are manufactured. Division of a wafer typified by the semiconductor wafer or the optical device wafer described above uses a laser processing apparatus which emits a laser beam to the wafer, for example. In Japanese Patent Laid-Open No. 2002-192370, a technique in which a laser beam is applied to a wafer to form a modified layer inside the wafer has been disclosed. In this technique, since a region formed with the modified layer becomes more breakable than other regions, an external force is applied to this wafer, so that the wafer is divided along the modified layer as a start point. In a case in which a wafer having a thickness of approximately 300 µm, for example, is divided by use of the above technique, a plurality of modified layers stacked one top of another are formed inside the wafer in a thickness direction thereof along one division line in order to appropriately divide the wafer with an external force to be applied. Accordingly, it is required to scan a laser beam along one division line plural times, causing a reduction in efficiency of processing a wafer.

In view of this, a technique has been proposed in which a laser beam of a wavelength passing through a wafer is applied to form a filament-like region called a shield tunnel inside the wafer (see Japanese Patent Laid-Open No. 2014-168790, for example). This shield tunnel includes a fine hole extending along a thickness direction of the wafer and an amorphous region shielding the fine hole. Since a region in which the shield tunnel is formed becomes more breakable than the other regions of the wafer, the shield tunnel functions as a division start point of the wafer. In order to form the shield tunnel described above, it is only necessary to apply a laser beam along each division line once, thereby forming a shield tunnel across a wide range in the thickness direction of the wafer. Thus, a laser beam applying step can be more simplified than the technique of forming a plurality of modified layers stacked, which has been described above.

SUMMARY OF THE INVENTION

After forming the shield tunnels along all of the division lines of the wafer, an external force is applied to the wafer, and the wafer is then divided into individual device chips along each of the shield tunnels functioning as a division start point. However, allowing the shield tunnel to function as the division start point requires a relatively larger external force to be applied in dividing the wafer, which is problematic. When a large external force is applied to the wafer, a processing defect such as a chipping or a crack is liable to occur in dividing the wafer, thereby causing a reduction in productivity of chips.

The present invention has been made in view of such problem, and it is therefore an object of the present invention to provide a wafer processing method capable of reducing an external force necessary for dividing a wafer to prevent a processing defect from occurring.

In accordance with an aspect of the present invention, there is provided a wafer processing method of dividing a wafer into a plurality of chips along a plurality of division lines, the method including: a shield tunnel forming step of causing a focusing point of a pulsed laser beam of a wavelength having a transmitting property with respect to the wafer to be positioned inside the wafer and applying the pulsed laser beam, and then forming a plurality of shield tunnels each including a fine hole and an amorphous region shielding the fine hole along the division lines; and a wafer dividing step of applying an external force to the wafer and then dividing the wafer in which the shield tunnels are formed along the division lines. In this wafer processing method, the pulsed laser beam is split to have two or more of the focusing points along a direction parallel to each of the division lines, and a distance between the focusing points adjacent to each other is smaller than 3 µm.

In accordance with another aspect of the present invention, there is provided a wafer processing method of dividing a wafer into a plurality of chips along a plurality of division lines, the method including: a shield tunnel forming step of causing a focusing point of a pulsed laser beam of a wavelength having a transmitting property with respect to the wafer to be positioned inside the wafer to apply the pulsed laser beam, and then forming a plurality of shield tunnels each including a fine hole and an amorphous region shielding the fine hole along the division lines; and a wafer dividing step of applying an external force to the wafer and then dividing the wafer in which the shield tunnels are formed along the division lines. In this wafer processing method, the pulsed laser beam has a beam spot of an elliptical shape having a major axis extending along a direction parallel to each of the division lines. Note that the pulsed laser beam may be split by a diffractive optical element.

The wafer processing method according to one aspect of the present invention forms shield tunnels in a wafer by applying pulsed laser beams having two or more focusing points or a pulsed laser beam having an elliptical beam spot to the wafer along each of division lines. Thus, formation of the shield tunnels can reduce an external force necessary for dividing the wafer, thereby preventing a processing defect from occurring.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
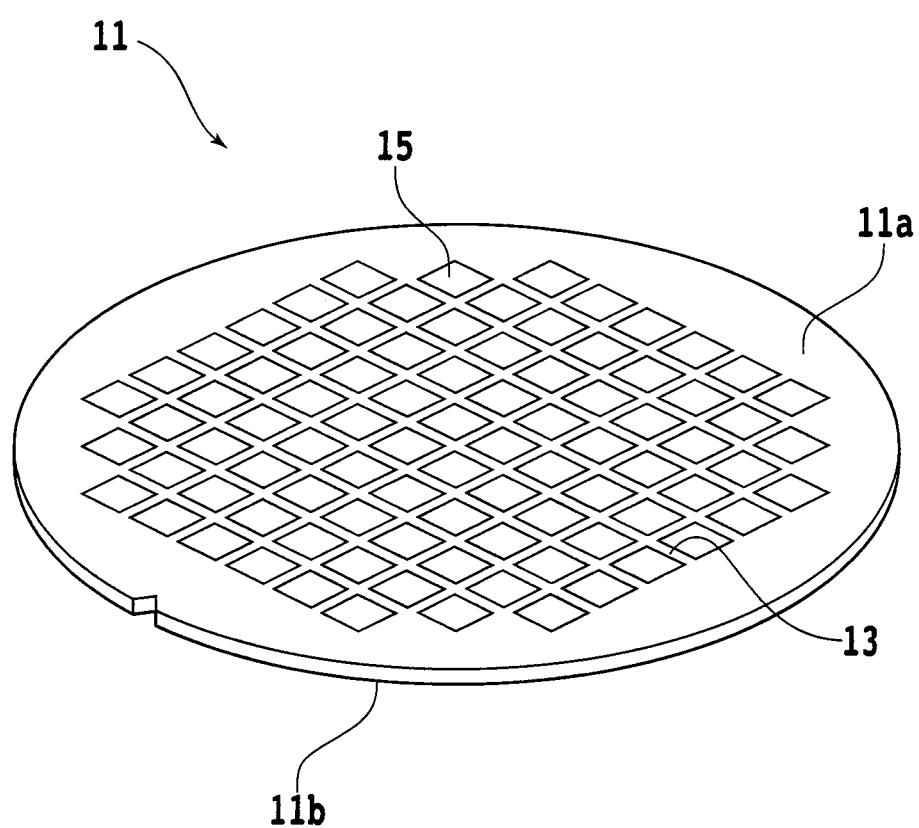
FIG. 1 is a perspective view illustrating a wafer.

A preferred embodiment of the present invention will be described below with reference to the attached drawings. First, a configuration example of a wafer which can be processed by a wafer processing method according to this embodiment will be described. FIG. 1 is a perspective view illustrating a wafer 11. The wafer 11 is formed into a circular disc shape and has a front surface 11a and a back surface 11b. The wafer 11 has a plurality of regions partitioned by a plurality of division lines (streets) 13 arrayed in a grid pattern so as to cross each other on the wafer 11, and a plurality of devices 15 such as ICs and LSIs are individually formed in the plurality of regions thus partitioned on the front surface 11a side. The wafer 11 is divided along the division lines 13, thereby obtaining a plurality of chips each including the device 15. Note that a material, a shape, a structure, a size, and the like of the wafer 11 are not limited. For example, the wafer 11 can be formed of a material such as a semiconductor (silicon, gallium arsenide (GaAs), indium phosphide (InP), gallium nitride (GaN), silicon carbide (SiC), or the like), glass, ceramic, resin, or metal. Also, a type, a numerical quantity, a shape, a structure, a size, a disposition, and the like of the device 15 are not limited.

Figure 2:
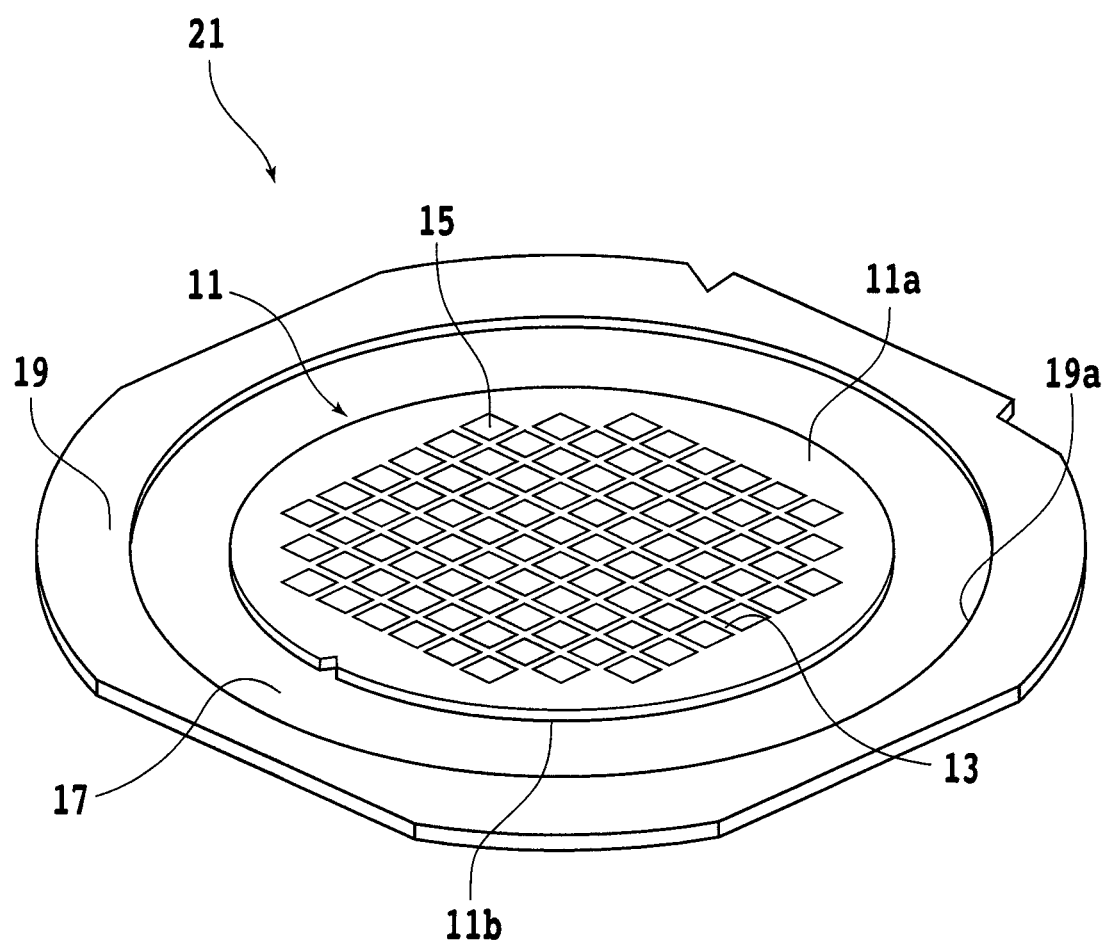
FIG. 2 is a perspective view illustrating a frame unit.

The wafer 11 is supported by an annular frame 19 through a circular tape 17, thereby constituting a frame unit 21. FIG. 2 is a perspective view illustrating the frame unit 21. As illustrated in FIG. 2, the back surface 11b side of the wafer 11 is first attached to a center portion of the circular tape 17 having a diameter larger than that of the wafer 11 and formed of resin or the like. Then, an outer periphery of the tape 17 is attached to the annular frame 19 provided with a circular opening 19a at its center. In this manner, the frame unit 21 is obtained in which the wafer 11 is supported by the annular frame 19 through the tape 17.

In the present embodiment, division start points are formed in the wafer 11 by applying a laser beam to the wafer 11 along the division lines 13. The division start point is a region functioning as a start point (trigger) from which the wafer 11 starts to be divided when an external force is applied to the wafer 11 in a latter step. Irradiation of the wafer 11 with a laser beam to is carried out by use of a laser processing apparatus.

Figure 3:
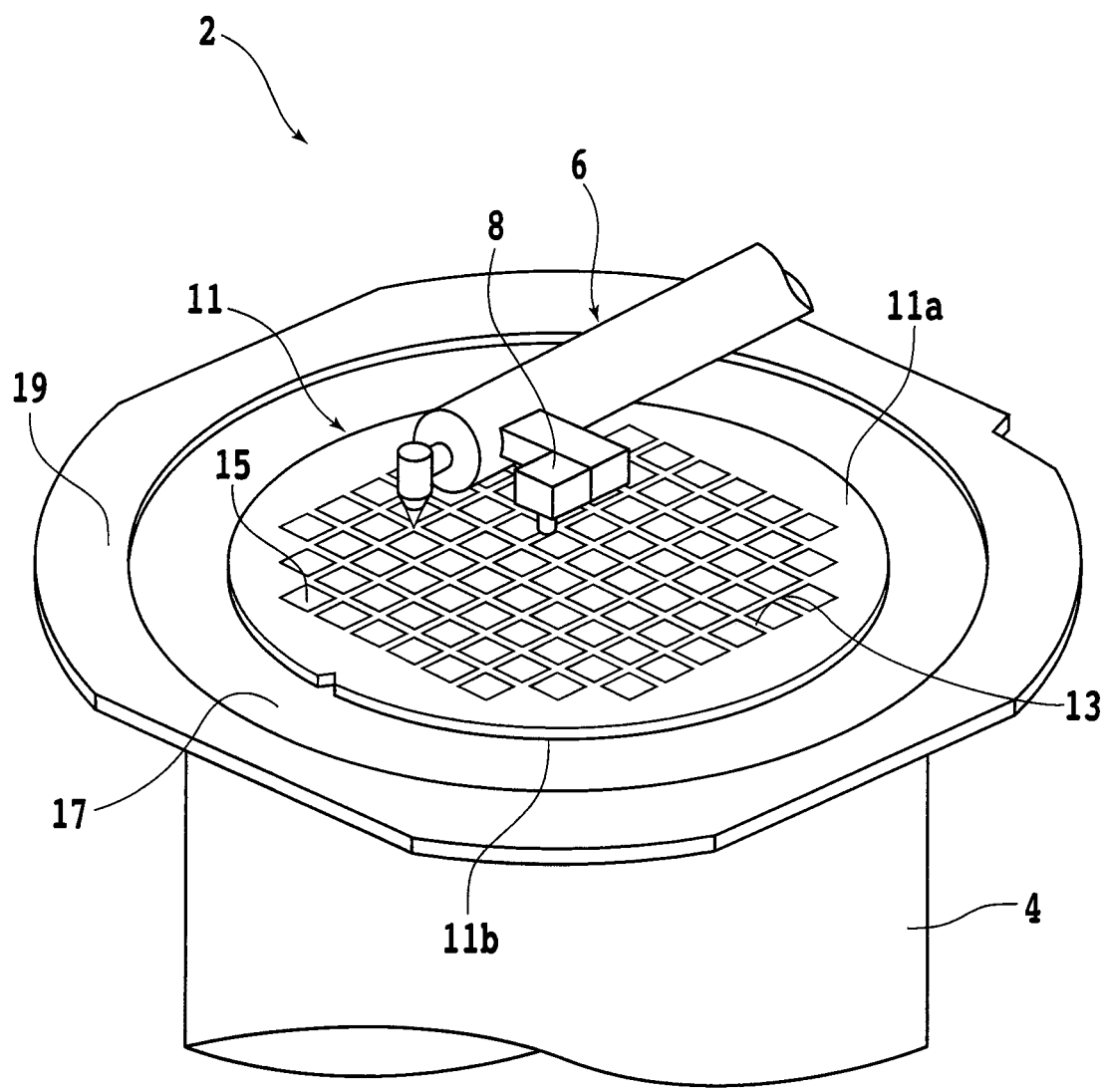
FIG. 3 is a perspective view illustrating a laser processing apparatus.
Figure 3:
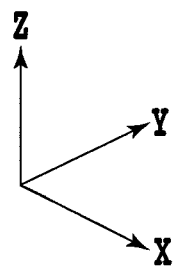

FIG. 3 is a perspective view illustrating a laser processing apparatus 2. The laser processing apparatus 2 includes a chuck table 4 for holding the wafer 11 thereon and a laser processing unit 6 irradiating the wafer 11 held on the chuck table 4 with a laser beam. The chuck table 4 sucks and holds the wafer 11 through the tape 17. More specifically, an upper surface of the chuck table 4 functions as a holding surface for holding the wafer 11, and this holding surface is connected with a suction source (not illustrated) through a suction passage (not illustrated) formed inside the chuck table 4. A plurality of clamps (not illustrated) are provided at a periphery of the chuck table 4, the clamps gripping the annular frame 19 for fixing. In addition, the chuck table 4 is coupled with a moving mechanism (not illustrated) and a rotation mechanism (not illustrated) which are both provided on a lower side of the chuck table 4. The chuck table 4 moves in an X-axis direction (processing feed direction) and a Y-axis direction (indexing direction) by the moving mechanism, and rotates around a rotation axis substantially parallel to a Z-axis direction (vertical direction) by the rotation mechanism. The wafer 11 is supported on the holding surface of the chuck table 4 through the tape 17 such that the front surface 11a of the wafer 11 is exposed upward. In addition, the annular frame 19 is fixed by the plurality of clamps provided at the periphery of the chuck table 4. A negative pressure generated by the suction source is applied to the holding surface of the chuck table 4 in this state, and accordingly, the wafer 11 is held under suction on the chuck table 4.

The laser processing unit 6 is disposed above the chuck table 4. The laser processing unit 6 is configured in such a way as to cause a pulsed laser beam of a wavelength having a transmitting property with respect to the wafer 11 (at least part of pulse laser beam is transmitted through the wafer 11) to be condensed at a predetermined position. In addition, on a lateral side of the laser processing unit 6, an imaging unit 8 for imaging the wafer 11 or the like is disposed. A position of each of the chuck table 4 and the laser processing unit 6 is controlled based on an image acquired by this imaging unit 8, and accordingly, a position of irradiating the wafer 11 with a laser beam is adjusted.

In the present embodiment, by irradiating the wafer 11 with a pulsed laser beam from the laser processing unit 6, a filament-like region called a shield tunnel is formed along each of the division lines 13. This shield tunnel includes a fine hole extending along a thickness direction of the wafer 11 and an amorphous region shielding the fine hole. Since the region in which the shield tunnel is formed becomes more breakable than the other regions of the wafer 11, the shield tunnel functions as a division start point of the wafer 11. Then, when an external force is applied to the wafer 11 formed with the shield tunnels along the division lines 13, the wafer 11 is thereby divided into a plurality of chips each including the device 15.

The shield tunnel is formed by irradiating the wafer 11 with a pulsed laser beam of a wavelength having a transmitting property with respect to the wafer 11 in such a way that a focusing point of the pulsed laser beam is positioned inside the wafer 11. However, in a case in which the pulsed laser beam is condensed at one location to form the shield tunnel, it has been known that a relatively larger external force is required in dividing the wafer 11 in a latter step. When a larger external force is applied to the wafer 11 in dividing, a processing defect such as a chipping or a crack is liable to occur, thereby causing a reduction in productivity of chips. As a result of intensive study on this problem by the present inventor, when a pulsed laser beam having two or more focusing points is applied to the wafer 11 to form shield tunnels, it has become clear that an external force necessary for dividing the wafer 11 can be reduced. It is inferred that this phenomenon is attributable to a larger remaining stress in the wafer 11 caused by formation of the shield tunnels as a result of application of the pulsed laser beam having two or more focusing points to the wafer 11, the remaining stress causing the wafer 11 to be more easily divided. In view of this, in the present embodiment, a pulsed laser beam having two or more focusing points is applied to the wafer 11 along the division lines 13, thereby forming shield tunnels in the wafer 11. Accordingly, an external force necessary for dividing the wafer 11 can be reduced, thereby preventing a processing defect from occurring.

Figure 4:
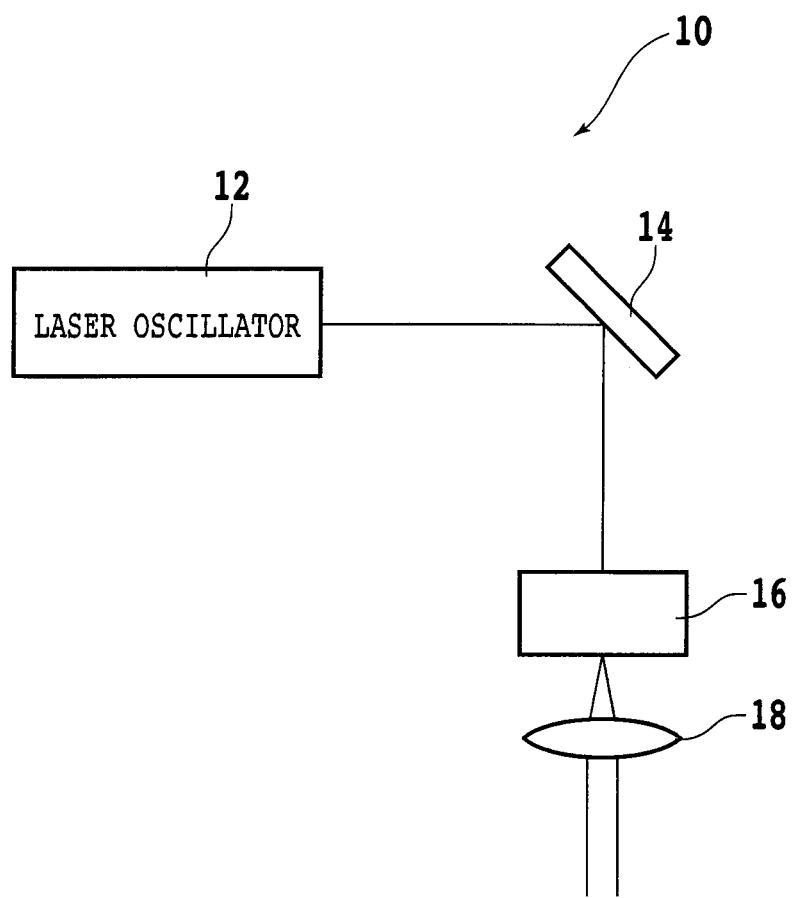
FIG. 4 is a schematic view illustrating an optical system.

A pulsed laser beam having two or more focusing points is generated by the laser processing unit 6 and applied to the wafer 11. FIG. 4 is a schematic view illustrating an optical system 10 capable of being used for the laser processing unit 6. The optical system 10 includes a laser oscillator 12 performing pulse oscillation of a laser beam. Examples of the laser oscillator 12 include an yttrium aluminum garnet (YAG) laser, an yttrium orthovanadate (YVO4) laser, and an yttrium lithium fluoride (YLF) laser, for example. A laser beam which has been pulse-oscillated by the laser oscillator 12 is reflected by a mirror 14 to enter a diffractive optical element (DOE) 16, by which the laser beam is split into two. Thereafter, the split pulsed laser beams are condensed by a condensing lens 18 at respective predetermined positions. The optical system 10 described above causes a pulsed laser beam to be split into pulsed laser beams having two or more focusing points. In this embodiment, an example in which the pulsed laser beams having two focusing points are generated has been described. As a modification, the laser processing unit 6 may be configured to generate pulsed laser beams having three or more focusing points.

Figure 5:
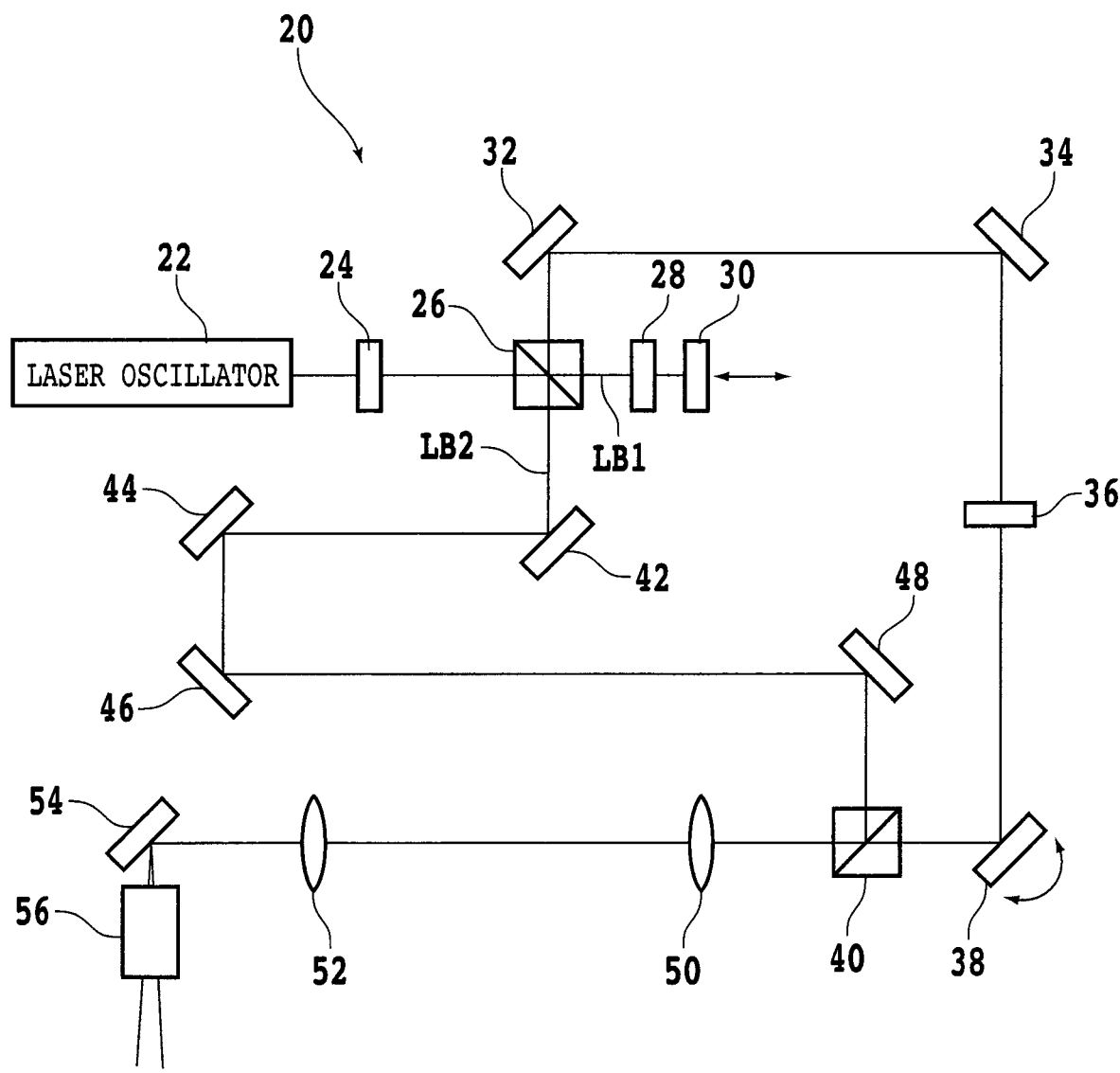
FIG. 5 is a schematic view illustrating another optical system.

Also, although the optical system 10 which causing a pulsed laser beam to be split into two by the diffractive optical element 16 has been illustrated in FIG. 4, the pulsed laser beam may be split by a polarizing beam splitter (PBS), alternatively. FIG. 5 is a schematic view illustrating an optical system 20 provided with a polarizing beam splitter.

The optical system 20 includes a laser oscillator 22 having a configuration and a function similar to those of the laser oscillator 12 (see FIG. 4). A laser beam is pulse-oscillated from the laser oscillator 22, and a polarization orientation thereof is then controlled by a λ/2 plate 24 having a variable angle. Thereafter, the pulsed laser beam enters a polarizing beam splitter 26. Then, the pulsed laser beam is split into two laser beams, specifically, a laser beam LB1 of P-polarized light and a laser beam LB2 of S-polarized light. The laser beam LB1 is transmitted through the polarizing beam splitter 26, and the laser beam LB2 is reflected by the polarizing beam splitter 26.

The laser beam LB1 transmitted through the polarizing beam splitter 26 passes through a λ/4 plate 28 and is reflected by a mirror 30. Thereafter, the reflected laser beam LB1 passes through the λ/4 plate 28 again to enter the polarizing beam splitter 26. Accordingly, a polarization plane of the laser beam LB1 rotates 90°, and the laser beam LB1 is reflected by the polarizing beam splitter 26. Note that the mirror 30 is movable in such a direction as to move close to or apart from the polarizing beam splitter 26. By changing a position of the mirror 30, an optical path length of the laser beam LB1 can be adjusted. The laser beam LB1 reflected by the polarizing beam splitter 26 is then reflected by a mirror 32 and a mirror 34 in this order before entering a λ/2 plate 36. As a result of entering the λ/2 plate 36, the polarization plate of the laser beam LB1 rotates 90°. After that, the laser beam LB1 is reflected by a mirror 38 to be transmitted through a polarizing beam splitter 40. In contrast, the laser beam LB2 reflected by the polarizing beam splitter 26 is reflected by mirrors 42, 44, 46, and 48 in this order and is then reflected by the polarizing beam splitter 40.

Each of the laser beam LB1 transmitted through the polarizing beam splitter 40 and the laser beam LB2 reflected by the polarizing beam splitter 40 passes through a lens 50 and a lens 52 in this order and then, reflected by a mirror 54. Thereafter, each of them is condensed at a predetermined position by an objective lens 56. Note that a position and an angle at which each of the laser beam LB1 and the laser beam LB2 enters the objective lens 56 are adjusted by the lens 50 and the lens 52. In this manner, it is possible to cause the pulsed laser beam to be split to thereby generate the pulsed laser beams having two focusing points by use of the optical system 20. Note that an angle of a reflection plane of the mirror 38 can be changed, so that a distance between two focusing points can be adjusted by changing an angle of the mirror 38. In addition, a position of the mirror 30 is adjusted to change the optical path length of the laser beam LB1, and accordingly, a difference in time (delay time) between the laser beam LB1 and the laser beam LB2 condensing at the respective focusing points can be controlled.

In the above description, there has been given an example in which the pulsed laser beam is split into two laser beams using the diffractive optical element and the polarizing beam splitter. However, a configuration of the optical system used for the laser processing unit 6 is not limited as long as the pulsed laser beam can be split. For example, the pulsed laser beam may be split using a spatial light phase modulator, a birefringent element, or the like.

Using the above laser processing unit 6, the pulsed laser beams having two or more focusing points are applied to the wafer 11 held under suction on the chuck table 4, thereby forming a shield tunnel in the wafer 11. A specific example of a method of forming a shield tunnel in the wafer 11 will be described with reference to FIGS. 6A, 6B, and 6C.

First, the wafer 11 is held under suction on the chuck table 4 such that the front surface 11a of the wafer 11 is exposed upward, and the chuck table 4 is moved such that the wafer 11 is positioned below the laser processing unit 6. Then, the chuck table 4 and the laser processing unit 6 are aligned with each other based on an image acquired by the imaging unit 8 (see FIG. 3), so that a position of irradiating the wafer 11 with a pulsed laser beam is adjusted.

Figure 6A:
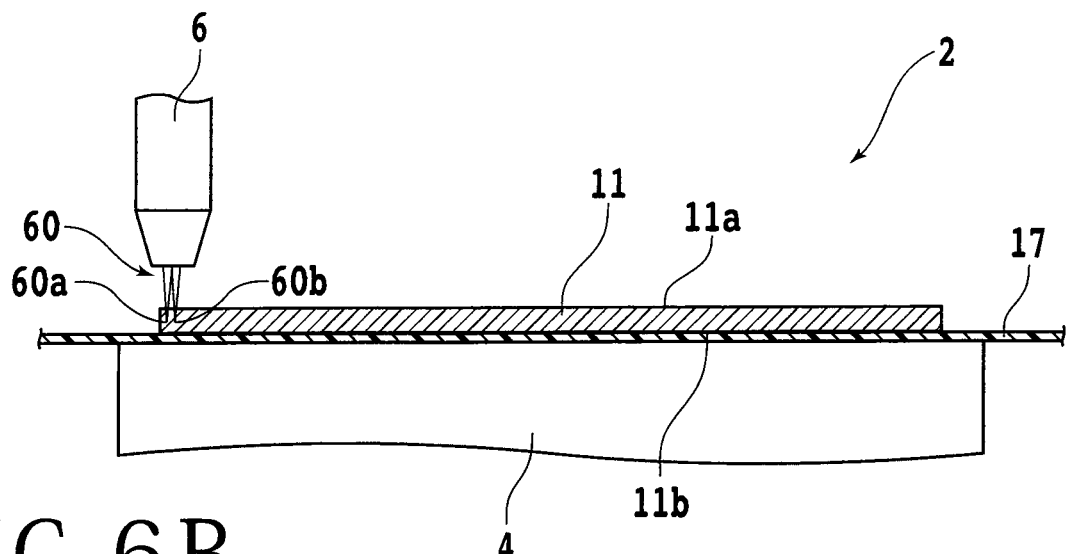
FIG. 6A is a partially cross-sectional side view illustrating a manner in which a pulsed laser beam is applied to the wafer.

Next, the laser processing unit 6 irradiates the wafer 11 with a pulsed laser beam 60 of a wavelength having a transmitting property with respect to the wafer 11. FIG. 6A is a partially cross-sectional side view illustrating a manner in which the pulsed laser beam 60 is applied to the wafer 11. The pulsed laser beam 60 has two focusing points 60a and 60b and is applied to the wafer 11 such that the focusing points 60a and 60b are positioned at different locations inside the wafer 11. FIG. 6A illustrates a state in which the focusing points 60a and 60b are positioned substantially in the middle of the front surface 11a and the back surface 11b. Note that the number of focusing points of the pulsed laser beam 60 may be three or more.

Then, the chuck table 4 is moved along a lengthwise direction (processing feed direction) of the division line 13 (see FIG. 1) such that the pulsed laser beam 60 is applied along one of the division lines 13 set on the wafer 11. Accordingly, the chuck table 4 and the laser processing unit 6 are moved relatively with respect to each other along the processing feed direction, so that the pulsed laser beam 60 is applied to the wafer 11 along one of the division lines 13. Note that the pulsed laser beam 60 is applied such that the focusing points 60a and 60b are displaced along a direction parallel to the processing feed direction (the lengthwise direction of the division line 13 to which the pulsed laser beam 60 is applied). A distance between the focusing points 60a and 60b can be set to larger than 0 μm to smaller than 3 μm, preferably, 0.5 μm or more to 2 μm or less. Also, a difference in time (a delay time of the pulsed laser beam 60) at which the pulsed laser beam 60 is applied to the focusing points 60a and 60b can be set to, for example, smaller than 33 ps, preferably, 16 ps or less.

Figure 6B:
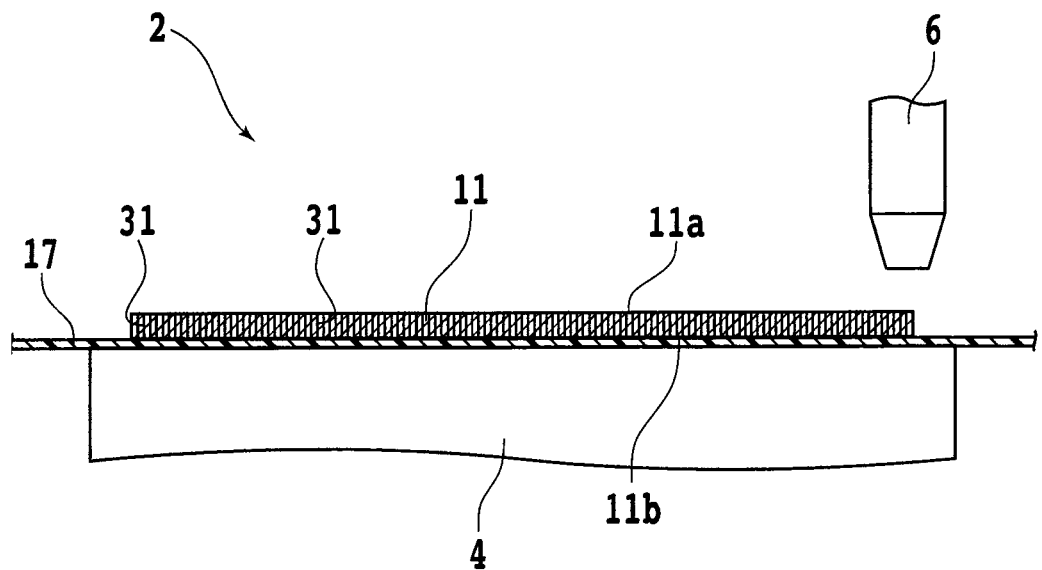
FIG. 6B is a partially cross-sectional side view illustrating a manner in which a plurality of shield tunnels are formed in the wafer.
Figure 6C:
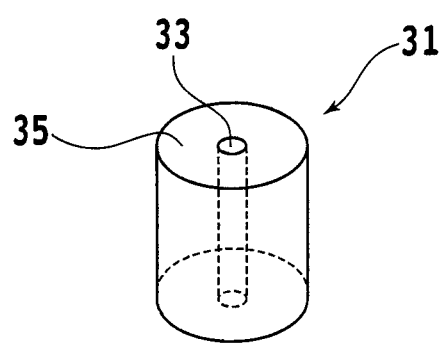
FIG. 6C is a schematic view illustrating the shield tunnel.

When the pulsed laser beam 60 is applied to the wafer 11 along one of the division lines 13, a plurality of shield tunnels are formed along the division line 13 in the wafer 11 (shield tunnel forming step). FIG. 6B is a partially cross-sectional side view illustrating a manner in which a plurality of shield tunnels 31 are formed in the wafer 11. The shield tunnel 31 is formed in a filament shape, starting respective locations at which the focusing points 60a and 60b are positioned and extending from the front surface 11a side to the back surface 11b side of the wafer 11. FIG. 6B illustrates an example in which the shield tunnels 31 are formed across the thickness direction, extending from the front surface 11a and reaching the back surface 1ib of the wafer 11. FIG. 6C is a schematic view illustrating the shield tunnel 31. The shield tunnel 31 includes a fine hole 33 extending along the thickness direction of the wafer 11 and an amorphous region 35 shielding the fine hole 33. Note that a diameter of the fine hole 33 is approximately smaller than 1 μm and a diameter of the amorphous region 35 is approximately 5 μm, and the respective amorphous regions 35 of the shield tunnels 31 adjacent to each other may be connected with each other. Thereafter, the pulsed laser beam 60 is similarly applied to the other division lines 13. Then, when the pulsed laser beam 60 is applied along all of the division lines 13 included in the wafer 11, the shield tunnel 31 forming step is completed.

Since a region in which the shield tunnel 31 is formed becomes more breakable than the other regions, the shield tunnel 31 functions as a division start point of the wafer 11. Accordingly, an external force is applied to the wafer 11 in which the shield tunnels 31 are formed along all of the division lines 13, so that the wafer 11 can be divided into a plurality of chips (wafer dividing step). The shield tunnel 31 can be formed by scanning the pulsed laser beam 60 once along each of the division line 13. Thus, the laser beam applying step can be more simplified than a case of using a method in which a plurality of modified layers stacked along each of division lines 13 inside the wafer 11, thereby achieving enhancement of efficiency of processing the wafer 11. In addition, when the pulsed laser beam 60 having two or more focusing points are applied to the wafer 11 to form the shield tunnels 31 as described above, an external force necessary for dividing the wafer 11 is reduced, compared to a case in which a pulsed laser beam is condensed at one location inside a wafer. Hence, using a processing method of the wafer 11 according to the present embodiment, an external force applied to the wafer 11 in dividing can be reduced. Accordingly, a processing defect such as a chipping or a crack can be prevented from occurring, so that a manufacturing yield of chips can be improved.

Next, an evaluation result of the wafer 11 formed with the shield tunnels by use of the wafer processing method according to the present embodiment will be described. In this evaluation, pulsed laser beam having two focusing points was applied to a wafer to form shield tunnels therein, and thereafter, an external force was applied to divide the wafer into individual chips, while a magnitude of the external force was measured in dividing the wafer.

In evaluation, a wafer composed of borosilicate glass having a length of 100 mm, a width of 25 mm, and a thickness of 0.3 mm was used. Also, the pulsed laser beam having two focusing points was generated by splitting a pulsed laser beam which had been pulse-oscillated from a laser oscillator, into two. The pulsed laser beam having two focusing points was applied to the wafer described above, while feeding the wafer in the processing feed direction, thereby obtaining the wafer formed with shield tunnels along the division lines. Note that the pulsed laser beam was condensed substantially in the middle of a depth direction of the wafer and were positioned such that the two focusing points were arrayed along a direction parallel to a processing feed direction. In addition, application conditions of the laser beams were set below.

Light source: YAG pulsed laser
Wavelength: 1064 nm
Energy: 40 μJ (before splitting)
Repetition frequency: 10 kHz
Processing Feed speed: 100 mm/s In formation of the above shield tunnels, five types of pulsed laser beams having different distances D between two focusing points were used. The distances D between the focusing points were 0 μm (positions of the two focusing points were identical), 0.5 μm, 1.0 μm, 2.0 μm, and 3.0 μm. Then, shield tunnels were formed for every ten wafers using each of the pulsed laser beams above. As a result, a total of 50 wafers in which the shield tunnels were formed were obtained.

Figure 7:
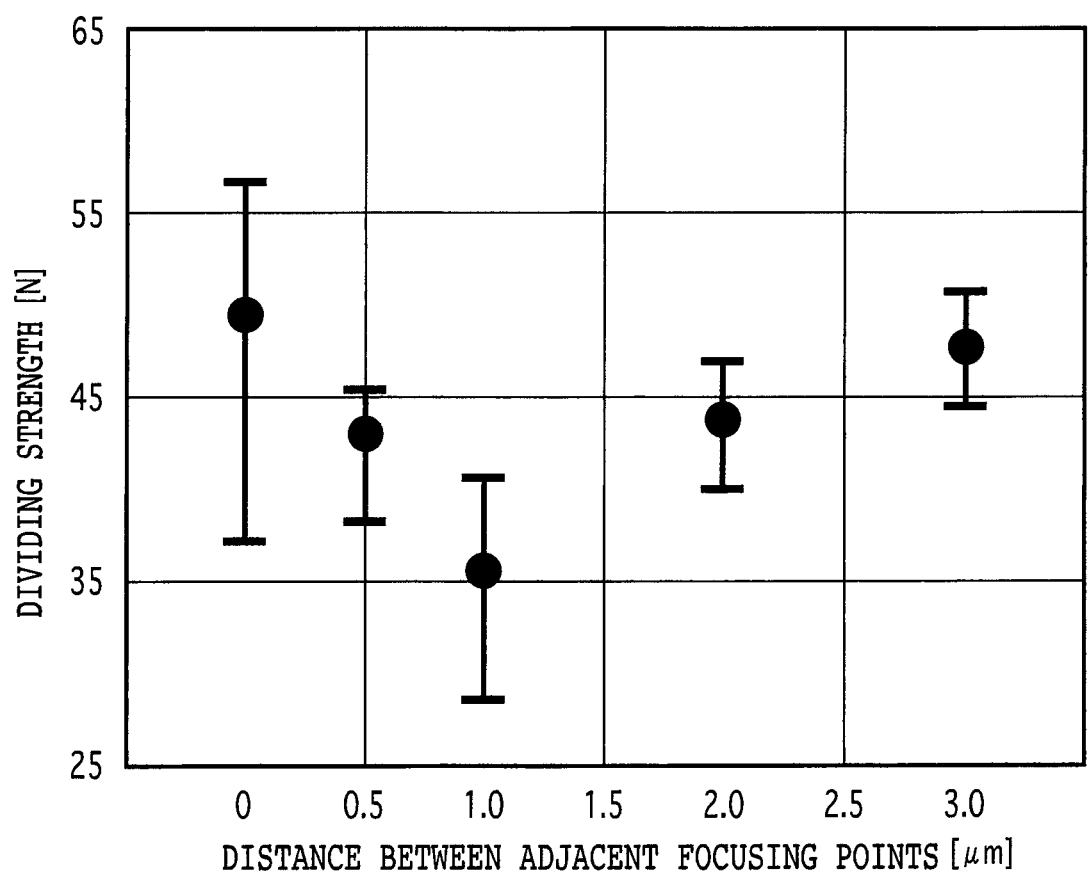
FIG. 7 is a graph indicating a relation between a distance between adjacent focusing points and a dividing strength.

Thereafter, each of the wafers was divided by applying an external force, and the external force (dividing strength) applied to the wafer in dividing was measured for each of the wafers. FIG. 7 is a graph indicating a relation between a distance D between adjacent focusing points and a dividing strength. Note that FIG. 7 depicts a circle indicating an average value of the dividing strength and an error bar representing an error range of the dividing strength. As indicated in FIG. 7, each dividing strength in cases in which two focusing points had been positioned at different locations inside a wafer (D>0 μm) became lower than that in a case in which two focusing points had been positioned at the same locations (D=0 μm). Hence, it has been clear that an external force necessary for dividing a wafer can be reduced by splitting a pulsed laser beam and causing the split laser beams to be condensed at different locations inside the wafer. However, note that, when the distance D had reached 3.0 μm (D=3 μm), the dividing strength increased up to a value substantially same as that in the case in which the distance D had been 0 μm (D=0 μm). Hence, a distance between focusing points of pulsed laser beam is preferably set to larger than 0 μm to smaller than 3 μm. In contrast, it has been clear that, in each case of D=0.5 μm, 1.0 μm, and 2.0 μm, the dividing strength is kept low comparing with the case of D=0 μm. Accordingly, the distance between the focusing points of the pulsed laser beam is preferably set to 0.5 μm or more to 2 μm or less. Note that the dividing strength is reduced particularly in the case of D=1.0 μm. In addition, in the case of D=1.0 μm, an elliptical processing mark in plan view was observed in the wafer after the pulsed laser beam had been applied thereto. Accordingly, when the distance D is set to D=1.0 μm, it can be considered that the two focusing points are connected with each other to thereby form a beam spot whose shape in a cross-section perpendicular to a traveling direction (a downward direction in FIG. 6A) of the connected pulsed laser beam is an elliptical shape. Then, when the pulsed laser beam described above is applied to the wafer, it has been confirmed that the dividing strength is greatly reduced.

Figure 8:
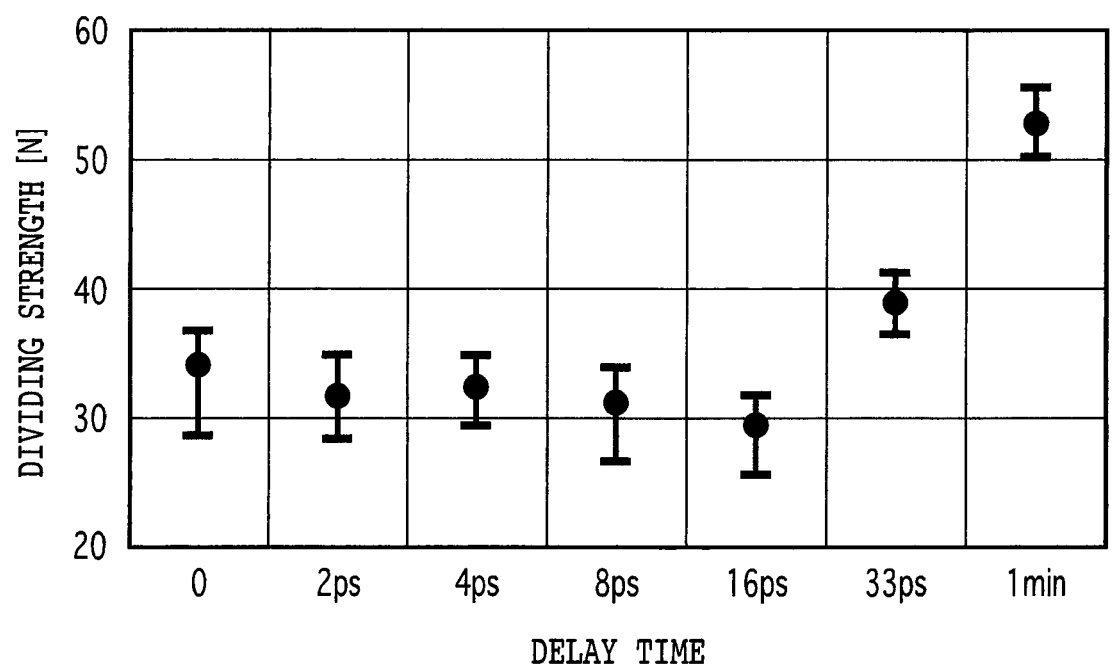
FIG. 8 is a graph indicating a relation between a delay time and a dividing strength.

Next, an influence due to a difference in time (delay time T) at which the pulsed laser beam was applied to the two focusing points was evaluated. In this evaluation, six types of pulsed laser beams each delay time T of which is 0 ps (simultaneous irradiation), 2 ps, 4 ps, 8 ps, 16 ps, or 33 ps were used. Note that a distance between two focusing points was uniformly set to 1 µm and adjustment of the delay time T was carried out using the optical system 20 in FIG. 5. Then, shield tunnels were formed in every ten wafers using each of the pulsed laser beams, thereby obtaining a total of 60 wafers in which the shield tunnels were formed. After that, an external force was applied to each of the wafers to divide each wafer into individual chips, while a dividing strength was measured in dividing each wafer. FIG. 8 is a graph indicating a relation between a delay time T and a division strength. Note that FIG. 8 depicts a circle indicating an average value of the dividing strength and an error bar representing an error range of the dividing strength. In addition, FIG. 8 also indicates the dividing strength in a case in which the delay time T is one minute as a reference example.

As indicated in FIG. 8, it has been clear that, when the delay time T reaches 33 ps, the dividing strength becomes larger than that in a case in which the pulsed laser beam is simultaneously applied to the two focusing points (T=0 ps). It is inferred that this is because, when a constant period of time or more has been elapsed after a pulsed laser beam is applied to one focusing point, a periphery of the application region of the pulsed laser beam is modified, and subsequent processing performed by the pulsed laser beam being thereafter applied to the other focusing point is likely to be inhibited by the modified region. Hence, the delay time T is preferably set to smaller than 33 ps. In contrast, even when pulsed laser beam was applied with a delay (T>0 ps), the dividing strength is kept equal to or lower than that in the case in which the pulsed laser beam is simultaneously applied to the two focusing points (T=0 ps), as long as the value of the dividing strength is 16 ps or less. Hence, the delay time T is more preferably set to 16 ps or less.

According to the foregoing results, it has been confirmed that application of the pulsed laser beam having the distance between the two focusing points set to a predetermined value forms the shield tunnels in the wafer, whereby an external force necessary for dividing the wafer can be reduced.

Although the case in which the pulsed laser beam having two or more focusing points is used has been described in the present embodiment, it is expected that a similar effect can be obtained even if the pulsed laser beam having the beam spot of an elliptical shape in a cross-section perpendicular to the traveling direction of the pulsed laser beam is used. In the case of using the pulsed laser beam having the beam spot of an elliptical shape, the pulsed laser beam is applied to the wafer such that a major axis direction of the beam spot extends along a direction parallel to the processing feed direction (the lengthwise direction of the division line to which the pulsed laser beam is applied), thereby forming shield tunnels. Note that a size of the beam spot can be suitably set according to a size of the division line 13. Also, a length of a minor axis of the beam spot can be set to ⅕ or more to ½ or less of a length of the major axis thereof, for example. Note that a method of forming a pulsed laser beam having the beam spot of an elliptical shape is not limited, and such beam spot can be formed by using a cylindrical lens, for example.

Besides, a structure, a method, and the like according to the above embodiment may be appropriately modified, and various modifications can be implemented without departing from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method of dividing a wafer into a plurality of chips along a plurality of division lines, wherein the wafer includes a front surface and a back surface, and a thickness direction is defined as a direction that extends between the front and back surfaces, the method comprising:
   a shield tunnel forming step of causing a focusing point of a pulsed laser beam of a wavelength having a transmitting property with respect to the wafer to be positioned inside the wafer and applying the pulsed laser beam, and then forming a plurality of shield tunnels each including a fine hole, extending in the thickness direction of the wafer, and an amorphous region shielding the fine hole along the division lines; and
   a wafer dividing step of applying an external force to the wafer and then dividing the wafer in which the shield tunnels are formed along the division lines,
   wherein the pulsed laser beam is split to have two or more of the focusing points along a direction parallel to each of the division lines, and
   a distance between the focusing points adjacent to each other is smaller than 3 µm.

2. The wafer processing method according to claim 1, wherein the pulsed laser beam is split by a diffractive optical element.

3. The wafer processing method according to claim 1, wherein the shield tunnels extend from the front surface to the back surface of the wafer.

4. The wafer processing method according to claim 1, wherein in each of the shield tunnels, the amorphous region surrounds the fine hole.

5. A wafer processing method of dividing a wafer into a plurality of chips along a plurality of division lines, wherein the wafer includes a front surface and a back surface, and a thickness direction is defined as a direction that extends between the front and back surfaces, the method comprising:
   a shield tunnel forming step of causing a focusing point of a pulsed laser beam of a wavelength having a transmitting property with respect to the wafer to be positioned inside the wafer to apply the pulsed laser beam, and then forming a plurality of shield tunnels each including a fine hole extending in the thickness direction of the wafer, and an amorphous region shielding the fine hole along the division lines; and
   a wafer dividing step of applying an external force to the wafer and then dividing the wafer in which the shield tunnels are formed along the division lines,
   wherein the pulsed laser beam has a beam spot of an elliptical shape having a major axis extending along a direction parallel to each of the division lines.

6. The wafer processing method according to claim 5, wherein the shield tunnels extend from the front surface to the back surface of the wafer.

7. The wafer processing method according to claim 5, wherein in each of the shield tunnels, the amorphous region surrounds the fine hole.

\* \* \* \* \*